United States Patent

Sheu

Patent Number: 5,915,171
Date of Patent: Jun. 22, 1999

[54] PROCESS OF FABRICATING AN ANTIFUSE STRUCTURE

[75] Inventor: Yau-Kae Sheu, Hsinchu, Taiwan

[73] Assignee: United Semiconductor Corp., Taiwan

[21] Appl. No.: 09/000,962

[22] Filed: Dec. 30, 1997

[30] Foreign Application Priority Data

Oct. 20, 1997 [TW] Taiwan .................................. 86115422

[51] Int. Cl.[6] .................................................. H01L 21/82
[52] U.S. Cl. ........................ 438/131; 438/467; 438/600; 257/530
[58] Field of Search .................................. 438/131, 132, 438/467, 600, 601; 257/530

[56] References Cited

U.S. PATENT DOCUMENTS

| | | | |
|---|---|---|---|
| 5,290,734 | 3/1994 | Boardman et al. | 438/600 |
| 5,726,483 | 3/1998 | Dennison | 438/467 |
| 5,756,393 | 5/1998 | Dennison | 438/600 |

*Primary Examiner*—John F. Niebling
*Assistant Examiner*—John Murphy
*Attorney, Agent, or Firm*—Rabin & Champagne, P.C.

[57] ABSTRACT

An antifuse structure for semiconductor programmable logic devices and the process of fabrication are described. The antifuse structure has its bottom electrically conductive layer featuring sharp corners formed by consumption of the polysilicon material into the sidewall in a thermal oxidation procedure. The sharp corners enhance the intensity of electric field established by a positive bias applied across the top and bottom conductive layers. The sharp corners do not enhance the electric field intensity when a negative bias is applied. This asymmetric conductivity assists in the reduction of the programming voltage as well as the increase of programming speed when the antifuse element is programmed.

11 Claims, 3 Drawing Sheets

PROCESS OF FABRICATING AN ANTIFUSE STRUCTURE

BACKGROUND OF THE INVENTION

1. Field of the Invention

This invention relates in general to a structure of antifuse for semiconductor programmable logic devices and the process of its fabrication. In particular, this invention relates to an antifuse structure exhibiting asymmetric conductivity that allows for lower programming voltage and the process of its fabrication.

2. Description of Related Art

Antifuses are circuit elements for programmable logic devices that are the reverse of fuses. They are programmed switches in these logic devices that are normally open as opposed to the normal-closed switch status of fuses. When circuit voltage or current applied across both terminals of an antifuse reaches to certain level in programming sessions, these antifuses become short-circuited, and it becomes a close-circuited switch for the circuitry.

With reference to FIG. 1, in which a cross-sectional view schematically showing the structural configuration of a conventional antifuse is shown, it can be observed that a first electrically conductive layer 11, normally a polysilicon layer, covers the surface of the field oxide layer 10. An oxide insulation layer 12 covers the entire first conductive layer 11 and the surrounding region of the field oxide layer 10. An opening is formed in the designated region of this oxide insulation layer 12, revealing portions of the surface of the first conductive layer 11. Sidewall of this opening is sloped, reducing the size of the opening as it descends toward the bottom. After the formation of this opening, a thin dielectric layer 13 such as an NO is formed, covering the surface of the oxide insulation layer 12, including the sloped sidewall and the bottom of the opening. A second conductive layer 14 such as polysilicon is then formed, covering the dielectric layer 13. This generally concludes the fabrication of a conventional antifuse element for programmable logic devices.

The prior-art antifuse structure as briefly described in the structure of FIG. 1 is with some drawbacks. For example, if the programmable logic device employing this prior-art antifuse element for its programmable switch, then scaling down of the element structural configuration must be done in order to achieve feature improvements such as reduced operating voltage or improved low-resistance state. This would include measures such as reduction of the thickness of the dielectric layer 13. However, such measures would inevitably incur problems such as increased difficulties in the control over fabrication process conditions as well as increased possibility of defects.

SUMMARY OF THE INVENTION

It is therefore an object of the invention to provide a structure for antifuse and its corresponding process of fabrication capable of effectively reducing the operating voltage by improving the structural disadvantages of the conventional antifuse utilizing the feature of asymmetric conductivity.

The invention achieves the above-identified object by providing an antifuse structure for semiconductor programmable logic devices that has a field oxide layer for the insulation of the antifuse structure. A first electrically conductive layer is formed over the top surface of the field oxide layer having sharp corner at the edges. An oxidized dielectric layer is formed on the lateral surface of the sidewall of the first electrically conductive layer proximate the sharp corners. An oxide insulation layer is formed on the top surface of the first electrically conductive layer. A second electrically conductive layer is then formed on the top surface of the oxide insulation layer, and further covering the oxidized dielectric layer and the field oxide layer.

The invention further achieves the above-identified object by providing a process for fabricating an antifuse structure for semiconductor programmable logic devices that includes the steps of first providing a field oxide layer for the insulation of the antifuse structure. A first electrically conductive layer is then formed over the top surface of the field oxide layer, and an oxide insulation layer then follows over the top surface of the first electrically conductive layer. A photolithographic procedure is then performed to subsequently etch into the oxide insulation layer, the first electrically conductive layer and the field oxide layer. A thermal oxidation procedure then follows to form an oxidized dielectric layer on the exposed sidewall of the first electrically conductive layer, the oxidized dielectric layer formed exhibiting a generally greater thickness at the central section than at the edges so as to form sharp corners at the edges of the first electrically conductive layer as it is being consumed in the thermal oxidation procedure. A second electrically conductive layer is then formed on the top surface of the oxide insulation layer, and further covering the oxidized dielectric layer and the field oxide layer.

BRIEF DESCRIPTION OF THE DRAWINGS

Other objects, features and advantages of the invention will become apparent by way of the following detailed description of the preferred but non-limiting embodiments. The description is made with reference to the accompanying drawings in which.

DESCRIPTION OF THE PREFERRED EMBODIMENT

The invention discloses a semiconductor structure for antifuses that can be used in programmable logic devices and the process of its fabrication. The structure is characterized in the sharp-corner configuration at the sidewall proximate to the bottom electric conductive layer. This is a structure capable of reducing the operating voltage of the antifuse element based on the asymmetric conducting property achieved by the structure of the invention, thereby effectively improving the drawbacks of conventional antifuses. A preferred embodiment in accordance with the invention is described below to show how the inventive structure can achieve this.

Figure 1:
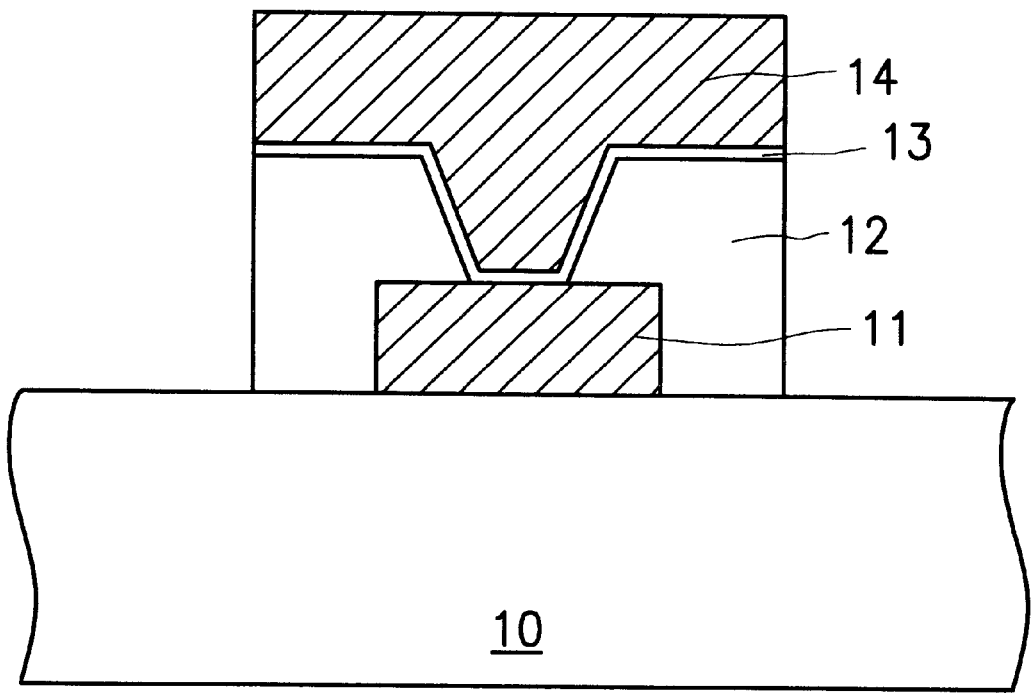
FIG. 1 is a cross-sectional view schematically showing the structural configuration of a prior-art antifuse structure.
Figure 2A:
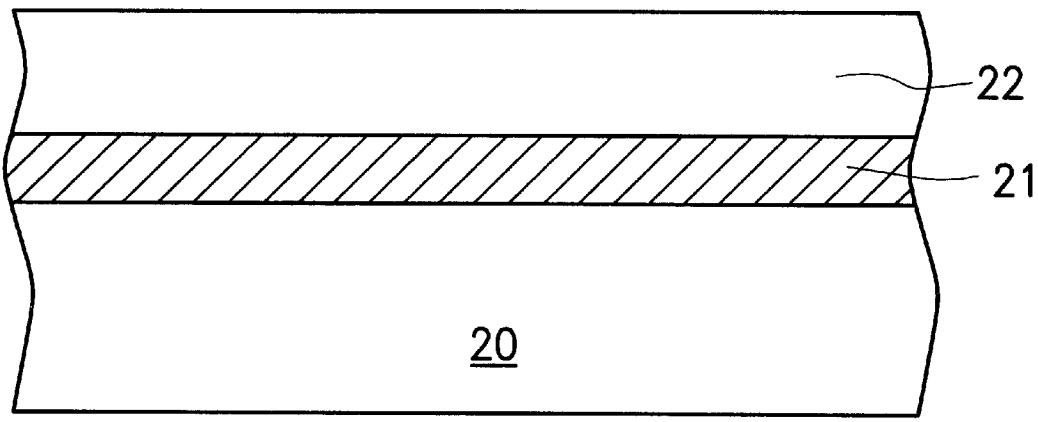
FIGS. 2A to 2D are cross-sectional views depicted from the process stages of fabrication of an antifuse in accordance with a preferred embodiment of the invention.

Refer to FIG. 2A, an oxide layer 20 is provided on the semiconductor wafer (not shown) to serve as the insulation basis for the antifuse element to be constructed. Layer 20 is an insulation layer with a thickness of about 3,000–5,000 Å. A first electrically conductive layer 21 can then be formed covering the surface of insulation layer 20. This conductive layer 21 can be formed of, for example, polysilicon that is used as the bottom conductive layer for the antifise unit. The conductive layer 21 has a thickness of about 1,000–3,000 Å. After conductive layer 21, another oxide insulation layer 22 is then formed, with a thickness of about 500–2,000 Å.

Figure 2B:
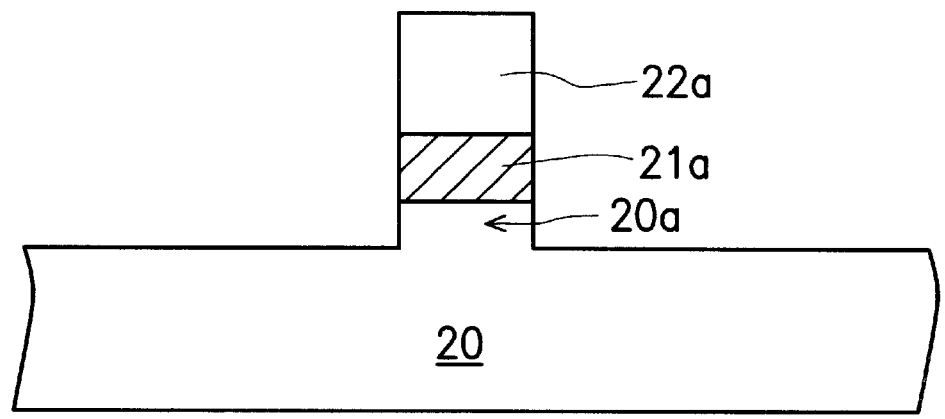

Then, in FIG. 2B, a photolithographic procedure is then conducted, in which a photoresist layer with predetermined pattern is formed on the surface of the oxide insulation layer 22. This allows for a controlled etching procedure to be implemented in order to etch subsequently into the oxide insulation layer 22, the first electrically conductive layer 21, and a portion into the depth of the base insulation layer 20. At the conclusion of this photolithographic processing, an island structure as viewed from the cross-sectional view of FIG. 2B is formed which still has the oxide insulation layer 22a covering the first conductive layer 21a. Since, as mentioned above, the etching was made into the base insulation layer 20, there is therefore the oxide pad 20a rising above the insulation layer 20 now having reduced thickness.

Figure 2C:
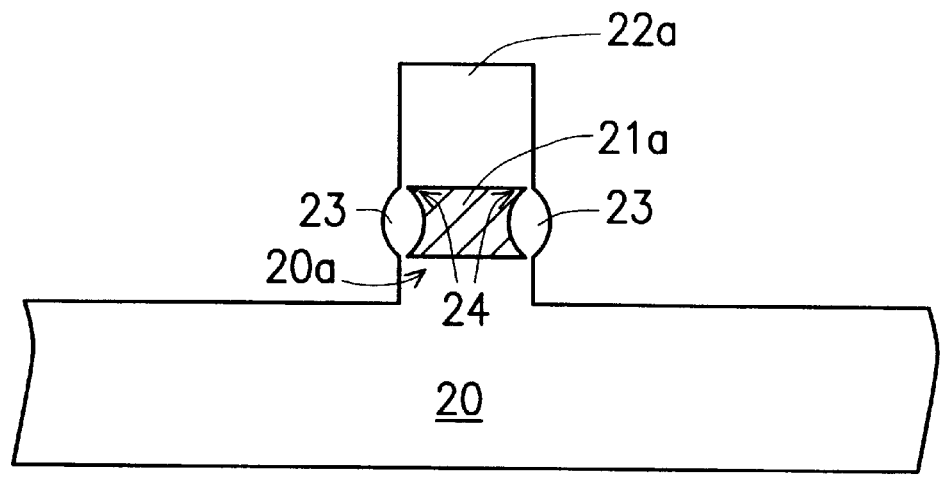

Then, a thermal oxidation procedure is then performed to the structure of FIG. 2B, resulting in the structure of FIG. 2C. In the oxidation procedure, sidewalls of both the oxide insulation layers 22a and 20a that are exposed are not affected by the high temperature of the atmospheric processing environment. However, exposed sidewall of the conductive layer 21 a can be oxidized by the high temperature. This results in the formation of the oxidized portions 23 that eventually grow out of the sidewall of the conductive layer 21 a as the thermal oxidation proceeds.

The formed oxidized portions 23 of the electrically conductive layer 21a become the oxidized dielectric layers 23 that protrude into the sidewall of layer 21a. And, as viewed from the cross-sectional view of FIG. 2C, the dielectric layers 23 has, in general, a spherical disk-shaped configuration. This is characterized by the thicker central portion in the dielectric layers 23, having a thickness of about 100–250 Å.

Note that the dielectric layers 23 are viewed to be aligned in the vertical direction in FIG. 2C. The edges of each of the layers 23, due to the presence of the corners of the first electrically conductive layer 21a, were grown to a smaller thickness than the central portion. This is because the rate of oxidation at these corner areas caused by high temperature of the thermal oxidation procedure was generally smaller than at the central. In general, the thickness of the formed dielectric layers 23 at the edges can be controlled to be about 50–70% of that at the central. As a result, as can be clearly observed in FIG. 2C, which, although not drawn to the exact scale, shows that the electrically conductive layer 21a has sharp corners 24. These sharp corners are formed around the four edges after the conclusion of the thermal oxidation procedure as viewed from the cross-sectional view.

Figure 2D:
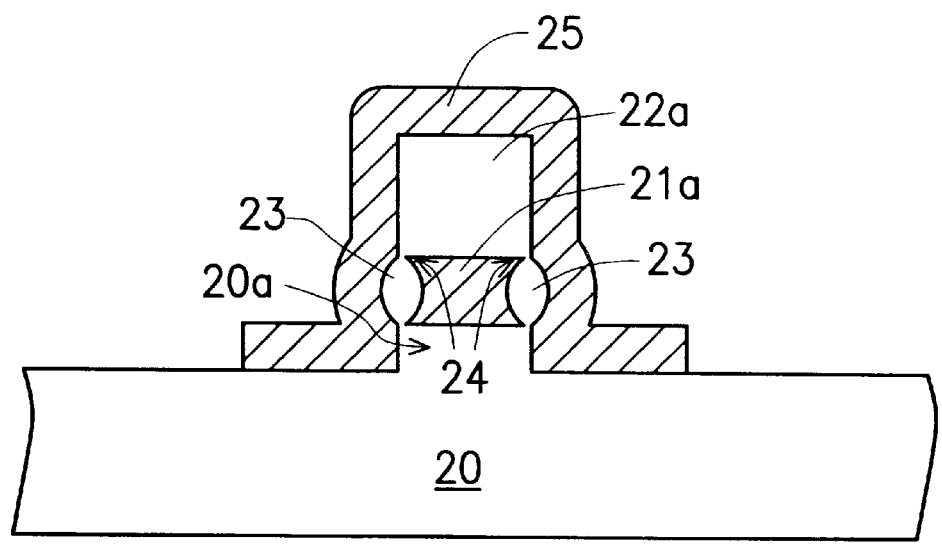

Finally, in FIG. 2D, a top electrically conductive layer can then be formed to cover the entire structure that includes the base insulation layer 20, the oxide insulation layer 20a, the oxidized dielectric layers 23, and the oxide insulation layer 22a. This top conductive layer can be formed of, for example, polysilicon, having a thickness of about 2,000–4,000 Å. The formed top electrically conductive layer can then be patterned in another photolithographic procedure, resulting in the final structure of the antifuse as outlined in the cross-sectional view of FIG. 2D.

Electrically conductive layer 21a of the antifuse structure of the invention featured with sharp corners have a distinguished benefit over the counterparts of the conventional structure that is without. As a positively-biased voltage is applied across the top and bottom electrically conductive layers, namely layers 25 and 21 a respectively, this sharp corner configuration in the conductive layer 21a can effectively enhance the strength of electric field intensity, so that electrons in the bottom conductive layer may be easier to reach the top conductive layer passing through the dielectric layer sandwiched in between. This results in the reduced breakdown voltage of the antifuse element, which means faster programming speed.

When, however, negatively-biased voltage is applied across the top and bottom electrically conductive layers 25 and 21a respectively, no such electric field intensity-enhancing effect is present. In other words, when reverse-biasing is applied, the breakdown of the antifuse element is achieved with substantially the same voltage, or speed, as that found in the conventional structures. This phenomenon is known as the asymmetric conductivity of the antifuse structural configuration. Enhanced electric field intensity arising as a result of the presence of sharp corners in the bottom electrically conductive layer can thus improve the operating condition of the antifuse element as it is under forward bias. The improvements would include at least the reduced programming voltage as well as increased programming speed. Since this can be achieved without the reduction of the thickness of the dielectric layer, therefore, it is particularly suitable for application to high-density semiconductor programmable logic devices utilizing fine resolution fabrication processes.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for fabricating an antifuse structure for semiconductor programmable logic devices comprising the steps of:

providing a field oxide layer for the insulation of the antifuse structure;

forming a first electrically conductive layer over the top surface of the field oxide layer;

forming an oxide insulation layer over the top surface of the first electrically conductive layer;

performing a photolithographic procedure to subsequently etch into the oxide insulation layer, the first electrically conductive layer and the field oxide layer;

performing a thermal oxidation procedure to form an oxidized dielectric layer on the exposed sidewall of the first electrically conductive layer, the oxidized dielectric layer formed exhibiting a generally greater thickness at the central section than at the edges so as to form sharp corners at the edges of the first electrically conductive layer as it is being consumed in the thermal oxidation procedure; and forming a second electrically conductive layer on the top surface of the oxide insulation layer, and further covering the oxidized dielectric layer and the field oxide layer.

2. The process of fabricating the antifuse structure according to claim 1, wherein the step of photolithographic procedure further comprises forming a pad oxide layer rising above the surface of the field oxide layer and covered under the first electrically conductive layer forming the first electrically conductive layer is formed of polysilicon.

3. The process of fabricating the antifuse structure according to claim 1, wherein the first electrically conductive layer is formed of polysilicon.

4. The process of fabricating the antifuse structure according to claim 1, wherein the second electrically conductive layer is formed of polysilicon.

5. The process of fabricating the antifuse structure according to claim 1, wherein the sharp corners of the first electrically conductive layer induces increased electric field intensity when a positive bias voltage is applied across the second and the first electrically conductive layers for reducing the breakdown voltage across the oxidized dielectric layer sandwiched in between.

6. The process of fabricating the antifuse structure according to claim 1, wherein the oxidized dielectric layer formed has a generally disk-shaped cross-sectional configuration with the central section having a greater thickness than the edges proximate to the sharp corners of the first electrically conductive layer.

7. The process of fabricating the antifuse structure according to claim 2, wherein the central section of the oxidized dielectric layer has a thickness of 100–250 Å, and the thickness of the edges of the oxidized dielectric layer has a thickness that is 50–70% of that of the central section.

8. The process of fabricating the antifuse structure according to claim 1, wherein the field oxide layer has a thickness of 3,000–5,000 Å.

9. The process of fabricating the antifuse structure according to claim 1, wherein the first electrically conductive layer has a thickness of 1,000–3,000 Å.

10. The process of fabricating the antifuse structure according to claim 1, wherein the oxide insulation layer has a thickness of 500–2,000 Å.

11. The process of fabricating the antifuse structure according to claim 1, wherein the second electrically conductive layer has a thickness of about 2,000–4,000 Å.

* * * * *